(12) United States Patent
Cha et al.

(10) Patent No.: US 12,366,892 B2
(45) Date of Patent: Jul. 22, 2025

(54) CONTACT GASKET, SSD CASE INCLUDING THE SAME, AND METHOD FOR MANUFACTURING THE SAME

(71) Applicant: Samsung Electronics Co., Ltd., Suwon-si (KR)

(72) Inventors: Jihye Cha, Suwon-si (KR); Jiyong Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 149 days.

(21) Appl. No.: 18/159,975

(22) Filed: Jan. 26, 2023

(65) Prior Publication Data
US 2024/0019912 A1     Jan. 18, 2024

(30) Foreign Application Priority Data

Jul. 12, 2022   (KR) .................. 10-2022-0085454

(51) Int. Cl.
| | |
|---|---|
| *G06F 1/16* | (2006.01) |
| *G06F 1/18* | (2006.01) |
| *H05K 9/00* | (2006.01) |

(52) U.S. Cl.
CPC .......... *G06F 1/1656* (2013.01); *G06F 1/1658* (2013.01); *G06F 1/182* (2013.01);
(Continued)

(58) Field of Classification Search
CPC ........ G06F 1/187; G06F 1/182; G06F 1/1656; G06F 1/1658; H05K 9/0015; H05K 9/0016
See application file for complete search history.

(56) References Cited

U.S. PATENT DOCUMENTS

| | | | |
|---|---|---|---|
| 7,113,410 B2 * | 9/2006 | Pawlenko | ................ H05K 5/15 174/32 |
| 7,492,608 B2 | 2/2009 | Harvey et al. | |

(Continued)

FOREIGN PATENT DOCUMENTS

| | | |
|---|---|---|
| JP | H05-12837 A | 1/1993 |
| KR | 100524991 B1 | 10/2005 |

(Continued)

OTHER PUBLICATIONS

Extended European Search Report dated Dec. 15, 2023 for corresponding European Application No. 23177954.7.

*Primary Examiner* — Nidhi Thaker

(74) *Attorney, Agent, or Firm* — Harness, Dickey & Pierce, P.L.C.

(57) ABSTRACT

Disclosed is an SSD case which includes a contact gasket formed of a conductive material having elasticity and provided in a space so as to be brought into contact with an upper case and a lower case. The contact gasket includes a lower case contact part that makes contact with the lower case and an upper case contact part that extends from the lower case contact part and makes contact with the upper case. One of the lower case contact part and the upper case contact part is fixedly fastened to the lower case or the upper case in contact therewith, and a contact protrusion that protrudes toward the lower case or the upper case such that an end is brought into contact with the lower case or the upper case is formed on the other one of the lower case contact part and the upper case contact part.

20 Claims, 10 Drawing Sheets

(52) U.S. Cl.
    CPC ........... *G06F 1/187* (2013.01); *H05K 9/0015* (2013.01); *H05K 9/0016* (2013.01)

(56) References Cited

U.S. PATENT DOCUMENTS

| | | | |
|---|---|---|---|
| 7,746,666 B2 * | 6/2010 | Kakinoki | H05K 9/0032 |
| | | | 361/818 |
| 8,353,709 B2 | 1/2013 | Tang et al. | |
| 8,541,696 B2 | 9/2013 | Cochrane | |
| 10,588,248 B1 | 3/2020 | Falslev et al. | |
| 11,017,820 B1 | 5/2021 | Khoo et al. | |
| 11,212,949 B2 * | 12/2021 | Kim | H05K 7/20472 |
| 11,245,230 B2 | 2/2022 | Dunwoody et al. | |
| 11,800,600 B2 * | 10/2023 | Tan | G06F 1/182 |
| 11,822,395 B2 * | 11/2023 | Tan | H05K 7/20454 |
| 2013/0155603 A1 | 6/2013 | Kaneko et al. | |
| 2021/0037685 A1 | 2/2021 | Kim et al. | |

FOREIGN PATENT DOCUMENTS

| | | |
|---|---|---|
| KR | 100618896 B1 | 9/2006 |
| KR | 10-2010-0024580 A | 3/2010 |

\* cited by examiner

CONTACT GASKET, SSD CASE INCLUDING THE SAME, AND METHOD FOR MANUFACTURING THE SAME

CROSS-REFERENCE TO RELATED APPLICATIONS

This application claims priority under 35 U.S.C. § 119 to Korean Patent Application No. 10-2022-0085454 filed on Jul. 12, 2022, in the Korean Intellectual Property Office, the disclosures of which are incorporated by reference herein in their entireties.

BACKGROUND

Example embodiments of the present disclosure described herein relate to an SSD case, and more particularly, relate to a contact gasket provided between an upper case and a lower case of an SSD case and an SSD case including the same.

A solid state drive or solid state disk (SSD) is a device that stores data using a memory element such as a flash memory. The SSD is used as a means for replacing a conventional hard disk drive (HDD) and the like. Compared to the conventional HDD, the SSD is a drive in a solid state that has no mechanically moving parts.

The SSD operates at higher speed by reducing seek time, latency, mechanical driving time, and the like and has improved reliability by decreasing an error due to mechanical friction. In general, the SSD is provided in a package form in which memory chips are mounted on a printed circuit board (PCB), and the SSD package is embedded in a closed or open case.

FIG. 1 is a perspective view illustrating one example of a general SSD case. FIG. 2 is a sectional view of the SSD case taken in a direction perpendicular to a lengthwise direction of the SSD case of FIG. 1. Referring to FIGS. 1 and 2, in general, an SSD is installed in a portable computer (e.g., a notebook computer) or a desktop computer by embedding a substrate 1 having the SSD mounted thereon in the SSD case 2.

In the related art, in order to embed the substrate 1 in the SSD case 2, a method of fixedly installing the substrate 1 in upper and lower cases 21 and 22 and fastening the upper and lower cases 21 and 22 through fastening means 3 such as bolts is used.

However, in the case of the SSD case 2 having the above-described structure, a gap may be generated between the upper case 21 and the lower case 22 due to a manufacturing tolerance and/or thermal interface materials (TIM) overlap for enhancement of thermal properties. Due to the gap, the upper case 21 and the lower case 22 may not be completely brought into contact with each other, and therefore an electrostatic discharge (ESD) level may not be satisfied.

SUMMARY

Example embodiments of the present disclosure provide a contact gasket for more stably maintaining contact between an upper case and a lower case of an SSD case.

In addition, example embodiments of the present disclosure provide a contact gasket for increasing an ESD level of an SSD case.

According to example embodiments, an SSD case includes a lower case including a bottom wall and an open upper portion, an upper case that is fastened with the lower case to cover the open upper portion and that forms a space in which an SSD substrate is accommodated, and a contact gasket formed of a conductive material having elasticity and provided in the space so as to be brought into contact with the upper case and the lower case. The contact gasket includes a lower case contact part that contacts the lower case and an upper case contact part that extends from the lower case contact part and makes contact with the upper case. One of the lower case contact part and the upper case contact part is fixedly fastened to the lower case or the upper case in contact therewith, and a contact protrusion that protrudes toward the lower case or the upper case such that an end is brought into contact with the lower case or the upper case is formed on the other one of the lower case contact part and the upper case contact part.

The upper case may include an upper wall that covers the open upper portion of the lower case and a sidewall that extends downward from a periphery of the upper wall. The lower case contact part may be fixedly fastened to the bottom wall so as to be brought into contact with an upper surface of the bottom wall. The upper case contact part may extend from an upper surface of the lower case contact part. The contact protrusion may protrude toward the sidewall from a surface of the upper case contact part that faces toward the sidewall such that the end is brought into contact with the sidewall.

The lower case contact part may have a shape extending along an edge region of the upper surface of the bottom wall, and the upper case contact part may extend upward from a partial area of an edge region of the upper surface of the lower case contact part that faces the sidewall.

The lower case contact part may be provided in a ring shape extending along the edge region of the upper surface of the bottom wall when the upper surface of the bottom wall is viewed.

The lower case contact part may have a plate structure in which opposite surfaces are parallel to the upper surface of the bottom wall, and the upper case contact part may have a plate structure in which opposite surfaces are parallel to an inside surface of the sidewall.

A protrusion receiving hole may be formed through opposite surfaces of the upper case contact part. An elastic support part that extends inward from one position on an inner surface of the protrusion receiving hole may be provided in the protrusion receiving hole. The contact protrusion may be formed on the elastic support part.

The lower case may further include a plurality of fastening protrusions to which fastening members that fasten the upper case and the lower case are fastened, the fastening protrusions being arranged along a periphery of the lower case. The lower case contact part may extend along an inside region of the fastening protrusion that faces toward a central region of the lower case.

The lower case contact part, the upper case contact part, and the contact protrusion may be provided in an integrated structure in which one plate is cut and bent.

According to example embodiments, a method for manufacturing a contact gasket provided in a receiving space for an SSD substrate so as to be brought into contact with a lower case and an upper case, wherein the lower case includes a bottom wall and an open upper portion, the upper case is fastened with the lower case to cover the open upper portion and forms the receiving space in which the SSD substrate is accommodated, the contact gasket includes a lower case contact part that makes contact with the lower case and an upper case contact part that extends from the lower case contact part and makes contact with the upper case, one of the lower case contact part and the upper case contact part is fixedly fastened to the lower case or the upper case in contact therewith, and a contact protrusion that protrudes toward the lower case or the upper case such that an end is brought into contact with the lower case or the upper case is formed on the other one of the lower case contact part and the upper case contact part, includes a first cutting operation of forming a plate structure including a region corresponding to the lower case contact part and a region corresponding to the upper case contact part by cutting a conductive plate having elasticity, a protrusion forming operation of forming the contact protrusion on the plate structure through a press process, and a bending operation of forming the contact gasket by bending the region corresponding to the lower case contact part of the plate structure and the region corresponding to the upper case contact part of the plate structure.

The first cutting operation and the protrusion forming operation may be simultaneously performed by the same mold.

A protrusion receiving hole may be formed through opposite surfaces of the upper case contact part, an elastic support part that extends inward from one position on an inner surface of the protrusion receiving hole may be provided in the protrusion receiving hole, and the contact protrusion may be formed on the elastic support part. The method may further include second cutting operation of forming the protrusion receiving hole and the elastic support part by cutting the region corresponding to the upper case contact part.

The first cutting operation, the second cutting operation, and the protrusion forming operation may be simultaneously performed by the same mold.

BRIEF DESCRIPTION OF THE FIGURES

The above and other objects and features of the present disclosure will become apparent by describing in detail example embodiments thereof with reference to the accompanying drawings.

DETAILED DESCRIPTION

Hereinafter, example embodiments of the present disclosure will be described clearly and in detail to such an extent that those skilled in the art easily implement the present disclosure.

Figure 1:
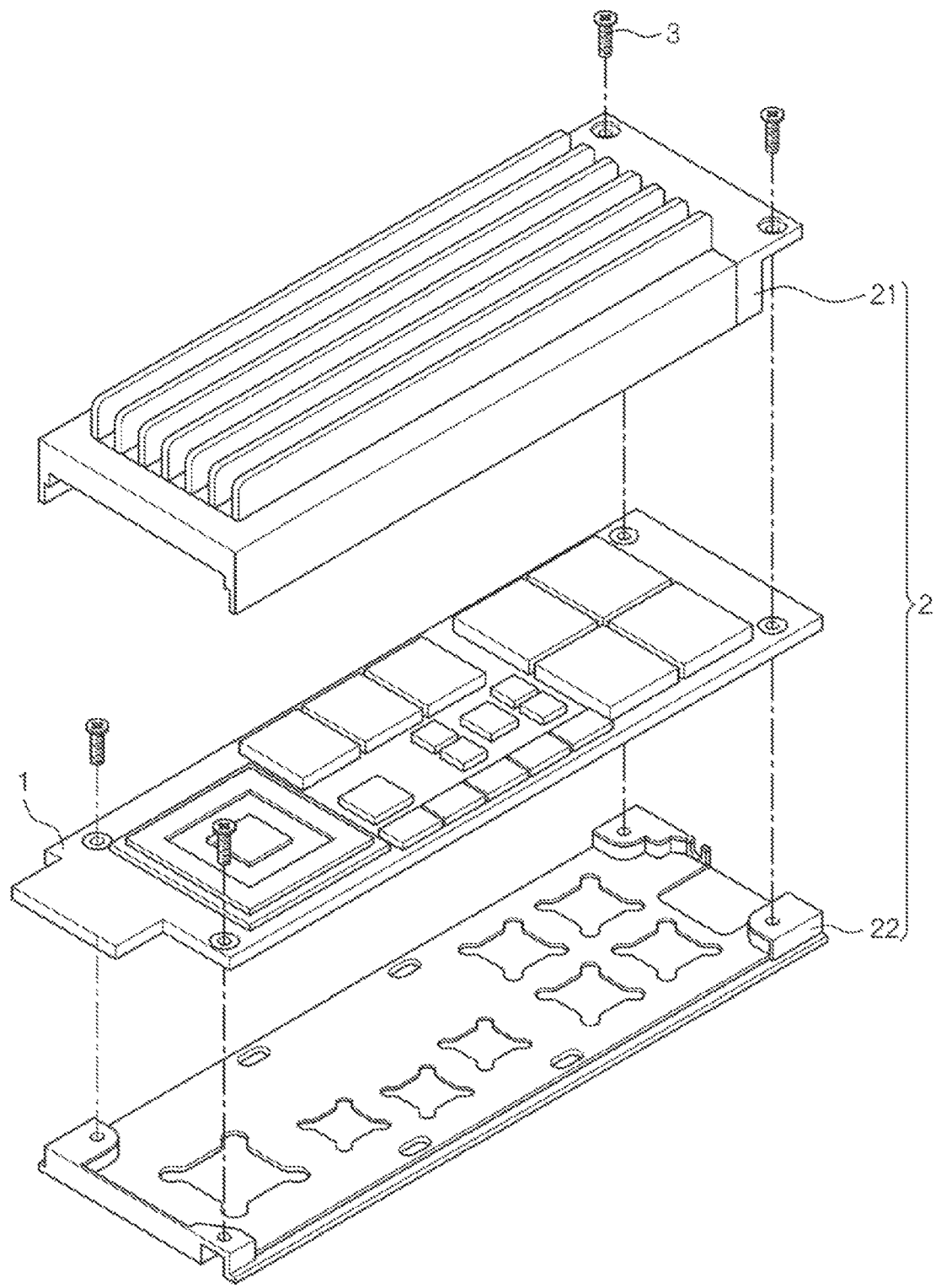
FIG. 1 is a perspective view illustrating one example of a general SSD case.
Figure 2:
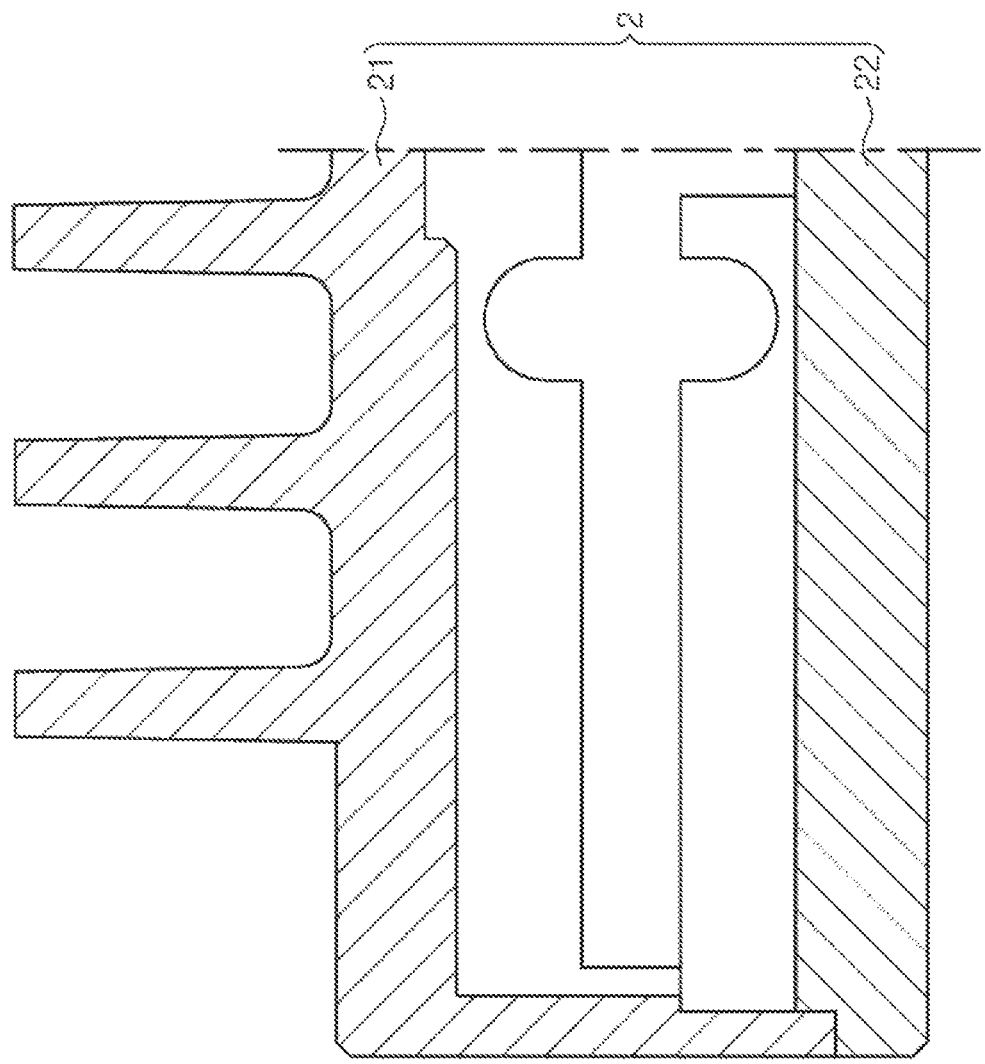
FIG. 2 is a sectional view of the SSD case taken in a direction perpendicular to a lengthwise direction of the SSD case of FIG. 1.
Figure 3:
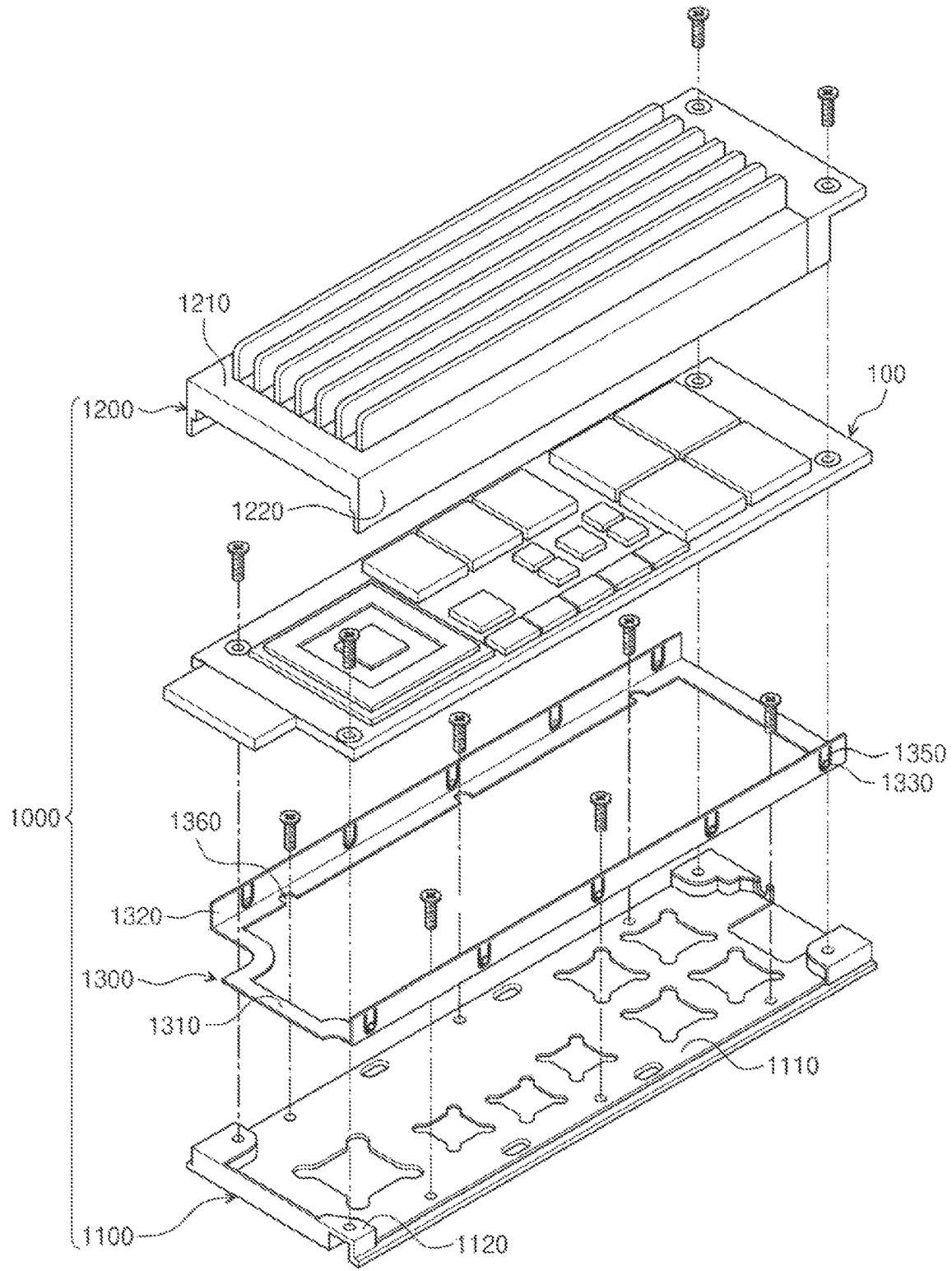
FIG. 3 is an exploded perspective view illustrating an SSD case according to example embodiments of the present disclosure.
Figure 4:
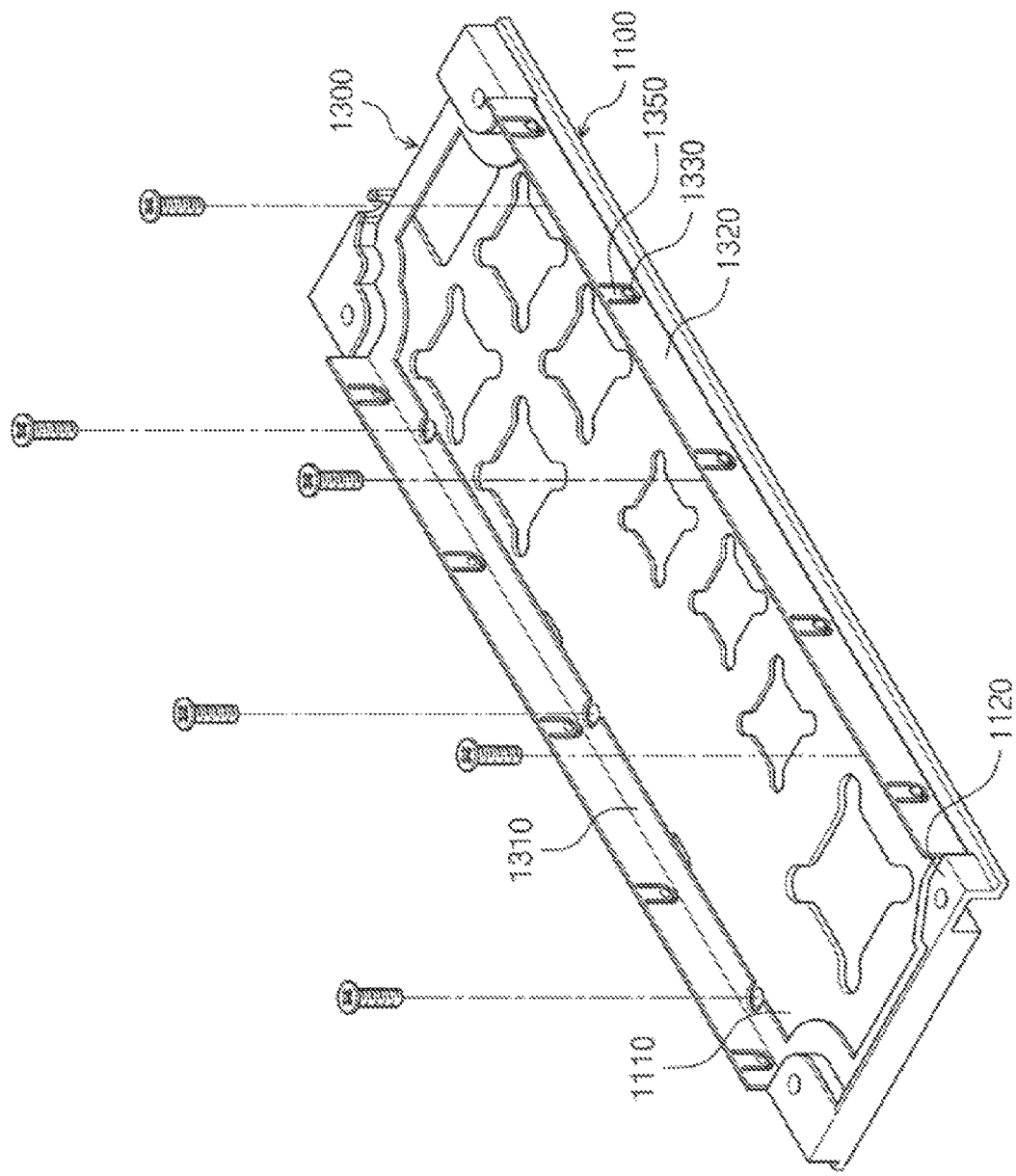
FIG. 4 is a perspective view illustrating a state in which a lower case and a contact gasket illustrated in FIG. 3 are fastened to each other.

FIG. 3 is an exploded perspective view illustrating an SSD case according to example embodiments of the present disclosure. FIG. 4 is a perspective view illustrating a state in which a lower case and a contact gasket illustrated in FIG. 3 are fastened to each other. Referring to FIGS. 3 and 4, an SSD substrate 100 having a solid state disk (SSD) mounted thereon is embedded in the SSD case 1000. According to example embodiments, the SSD case 1000 may include the lower case 1100, an upper case 1200, and the contact gasket 1300.

The lower case 1100 may include a bottom wall 1110 and a fastening protrusion 1120. An upper portion of the lower case 1100 may be open.

A fastening member that fastens the upper case 1200 and the lower case 1100 is fastened to the fastening protrusion 1120. According to example embodiments, the fastening protrusion 1120 may be provided in a structure protruding upward from the bottom wall 1110 of the lower case 1100. The fastening member may be implemented with a bolt that passes through the upper case 1200 and that is fastened to an upper surface of the fastening protrusion 1120. A plurality of fastening protrusions 1120 may be arranged along the periphery of the lower case 1100 so as to be spaced apart from each other. The fastening protrusion 1120 may be provided in a different structure, or may not be provided, depending on a fastening method of the upper case 1200 and the lower case 1100.

The upper case 1200 is fastened with the lower case 1100 to cover the upper portion of the lower case 1100 and forms a space in which the SSD substrate 100 is accommodated. According to example embodiments, the upper case 1200 may include an upper wall 1210 and a sidewall 1220. The upper wall 1210 covers the open upper portion of the lower case 1100. The sidewall 1220 extends downward from the periphery of the upper wall 1210. The sidewall 1220 hides a gap between the upper case 1200 and the lower case 1100 fastened with each other.

The contact gasket 1300 is formed of a conductive material having elasticity. For example, the contact gasket 1300 may be formed of a metallic material. The contact gasket 1300 is provided in the space formed by the upper case 1200 and the lower case 1100 and is brought into contact with the upper case 1200 and the lower case 1100. According to example embodiments, the contact gasket 1300 may include a lower case contact part 1310 and an upper case contact part 1320.

The lower case contact part 1310 makes contact with the lower case 1100. The upper case contact part 1320 makes contact with the upper case 1200. The upper case contact part 1320 extends from the lower case contact part 1310. One of the lower case contact part 1310 and the upper case contact part 1320 is fixedly fastened to the lower case 1100 or the upper case 1200 in contact therewith, and the other one has a contact protrusion 1330 formed thereon.

According to example embodiments, the lower case contact part 1310 is fixedly fastened to the bottom wall 1110 so as to be brought into contact with an upper surface of the bottom wall 1110 of the lower case 1100. The upper case contact part 1320 extends upward from an upper surface of the lower case contact part 1310. The lower case contact part 1310 may be provided in a shape extending along an edge region of the upper surface of the bottom wall 1110 of the lower case 1100.

For example, the lower case contact part 1310 may be provided in a ring shape that extends along the edge region of the upper surface of the bottom wall 1110 to surround a central region of the bottom wall 1110 when the upper surface of the bottom wall 1110 is viewed. The lower case 1100 may include the fastening protrusion 1120 having the above-described structure. In some example embodiments, in a region adjacent to the fastening protrusion 1120 of the bottom wall 1110 of the lower case 1110, the lower case contact part 1310 may extend along an inside region of the fastening protrusion 1120 that faces toward a central region of the lower case 1100. According to this example embodiment, the lower case contact part 1310 may be provided in a plate structure in which opposite surfaces are parallel to an upper surface of the lower case 1100.

According to example embodiments, the upper case contact part 1320 extends upward from a partial area of an edge region of the upper surface of the lower case contact part 1310 that faces the sidewall 1220. For example, the upper case contact part 1320 may be provided in a plate structure in which opposite surfaces are parallel to an inside surface of the sidewall 1220.

The contact gasket 1300 may be fastened to the lower case 1100 by a bolt passing through the lower case contact part 1310 and the bottom wall 1110 of the lower case 1100. In some example embodiments, the lower case contact part 1310 may have a bolt recess 1360 formed therein through which the bolt passes. For example, a plurality of bolt recesses 1360 may be arranged along an inside edge region of the lower case contact part 1310 so as to be spaced apart from each other. The bolt recess 1360 may be provided in a structure in which a region facing toward the central region of the bottom wall 1110 is open. However, without being limited thereto, the bolt recess 1360 may be provided in various positions and structures depending on the fastening position and size of the bolt.

Figure 5:
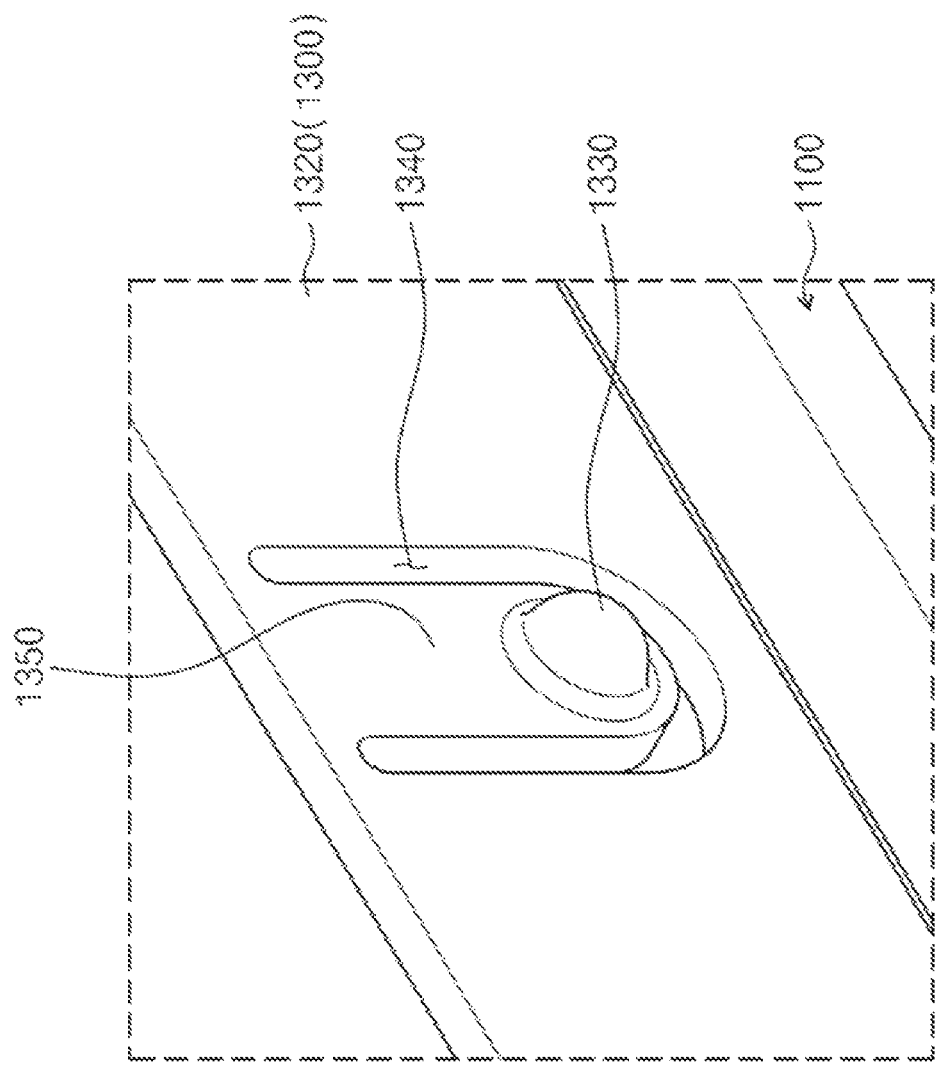
FIG. 5 is an enlarged perspective view illustrating a contact protrusion, a protrusion receiving hole, and an elastic support part illustrated in FIG. 3.
Figure 6:
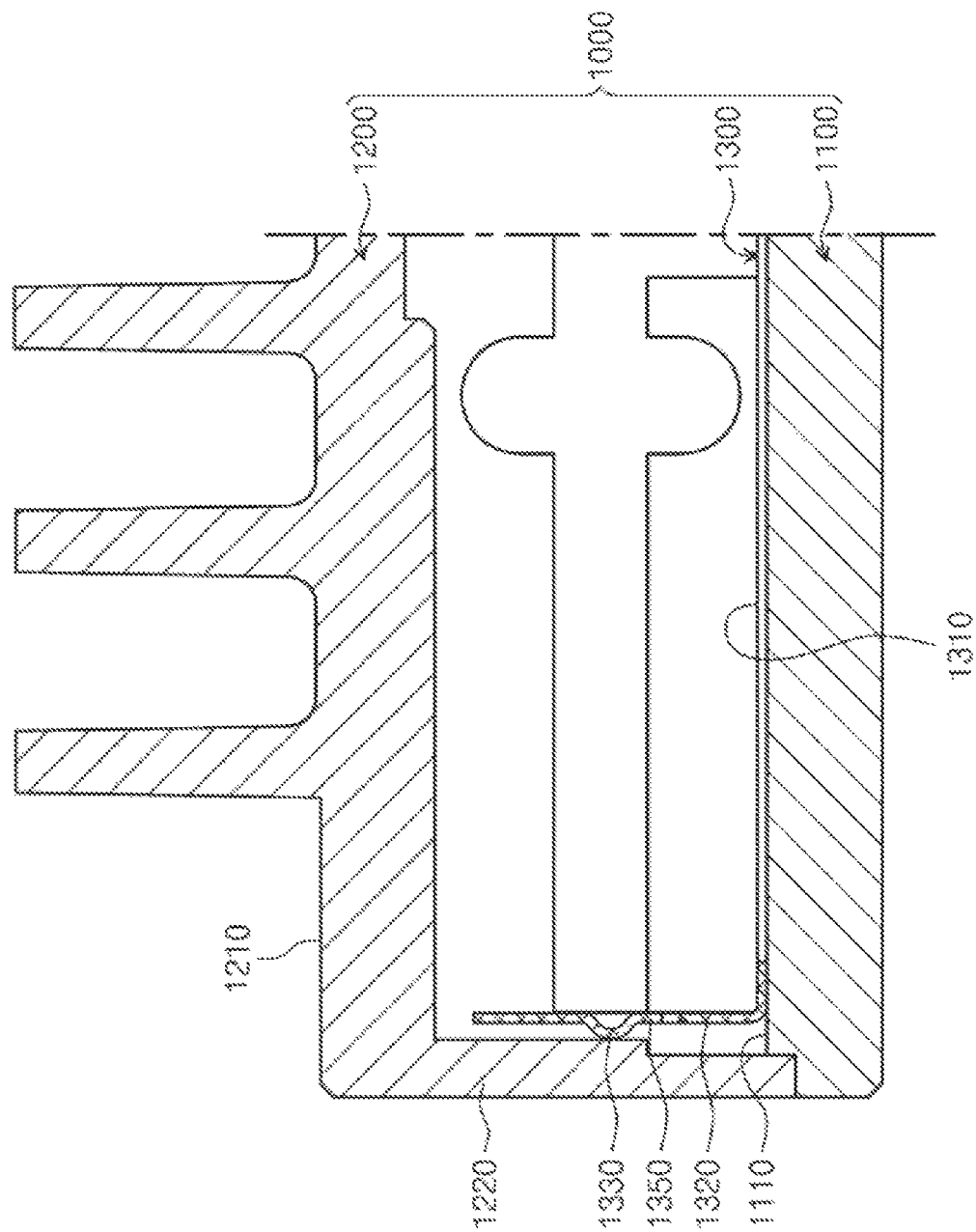
FIG. 6 is a sectional view taken in a direction perpendicular to a lengthwise direction of a configuration in which an upper case, the lower case, and the contact gasket of FIG. 3 are fastened.

FIG. 5 is an enlarged perspective view illustrating the contact protrusion, a protrusion receiving hole, and an elastic support part illustrated in FIG. 3. FIG. 6 is a sectional view taken in a direction perpendicular to a lengthwise direction of a configuration in which the upper case, the lower case, and the contact gasket of FIG. 3 are fastened. Referring to FIGS. 5 and 6, the contact protrusion 1330 protrudes toward the lower case 1100 or the upper case 1200 such that an end is brought into contact with the lower case 1100 or the upper case 1200. According to example embodiments, the contact protrusion 1330 protrudes toward the sidewall 1220 from a surface of the upper case contact part 1320 that faces toward the sidewall 1220, such that the end is brought into contact with the sidewall 1220 of the upper case 1200.

For example, the protrusion receiving hole 1340 may be formed through the opposite surfaces of the upper case contact part 1320. The elastic support part 1350 extending inward from one position on an inner surface of the protrusion receiving hole 1340 may be provided in the protrusion receiving hole 1340. In the case in which the elastic support part 1350 is provided, the contact protrusion 1330 is formed on the elastic support part 1350. The elastic support part 1350 may be formed by cutting away a portion of the upper case contact part 1320 such that an upper end of the elastic support part 1350 is connected with the upper case contact part 1320.

Accordingly, when the upper case contact part 1320 has a plate structure, the elastic support part 1350 may also be provided in a plate structure. In some example embodiments, the contact protrusion 1330 may be provided in a structure in which one surface facing toward the sidewall 1220 of the upper case 1200 is convex and an opposite surface is concave. To this end, the contact protrusion 1330 may be formed by pressing a surface of the elastic support part 1350 facing a direction away from the sidewall 1220 of the upper case 1200 in a direction toward the sidewall 1220 of the upper case 1200.

In example embodiments in which the elastic support part 1350 is not provided, one contact protrusion 1330 may excessively protrude further than other contact protrusions 1330 due to a manufacturing tolerance. The excessively protruding contact protrusion 1330 may be pushed by the sidewall 1220. When the upper case contact part 1320 itself is pushed, another contact protrusion 1330 of the corresponding upper case contact part 1320 may not be brought into contact with the sidewall 1220 of the upper case 1200.

Accordingly, when the elastic support part 1350 is provided, even though a slightly excessively protruding contact protrusion 1330 is pushed by the sidewall 1220, only the elastic support part 1350 having the contact protrusion 1330 formed thereon may be pushed, and thus contact of other contact protrusions 1330 with the sidewall 1220 may not be affected.

Assuming that the contact protrusion 1330 is not provided, the surface of the upper case contact part 1320 that faces toward the sidewall 1220 of the upper case 1200 may be in contact with the sidewall 1220 of the upper case 1200 while facing the sidewall 1220. In contrast, assuming that the contact protrusion 1330 is provided, a protruding length of the contact protrusion 1330 may be longer than the distance between the upper case contact part 1320 and the sidewall 1220 of the upper case 1200 in example embodiments in which the surface of the upper case contact part 1320 that faces toward the sidewall 1220 of the upper case 1200 is spaced apart from the sidewall 1220 of the upper case 1200.

According to example embodiments, the lower case contact part 1310, the upper case contact part 1320, the contact protrusion 1330, and the elastic support part 1350 may be provided in an integrated structure in which one plate is cut and bent.

Hereinafter, one example of a method of manufacturing the contact gasket 1300 according to the above-described example embodiments will be described. However, without being limited thereto, the contact gasket 1300 may be manufactured by various manufacturing methods.

Figure 7:
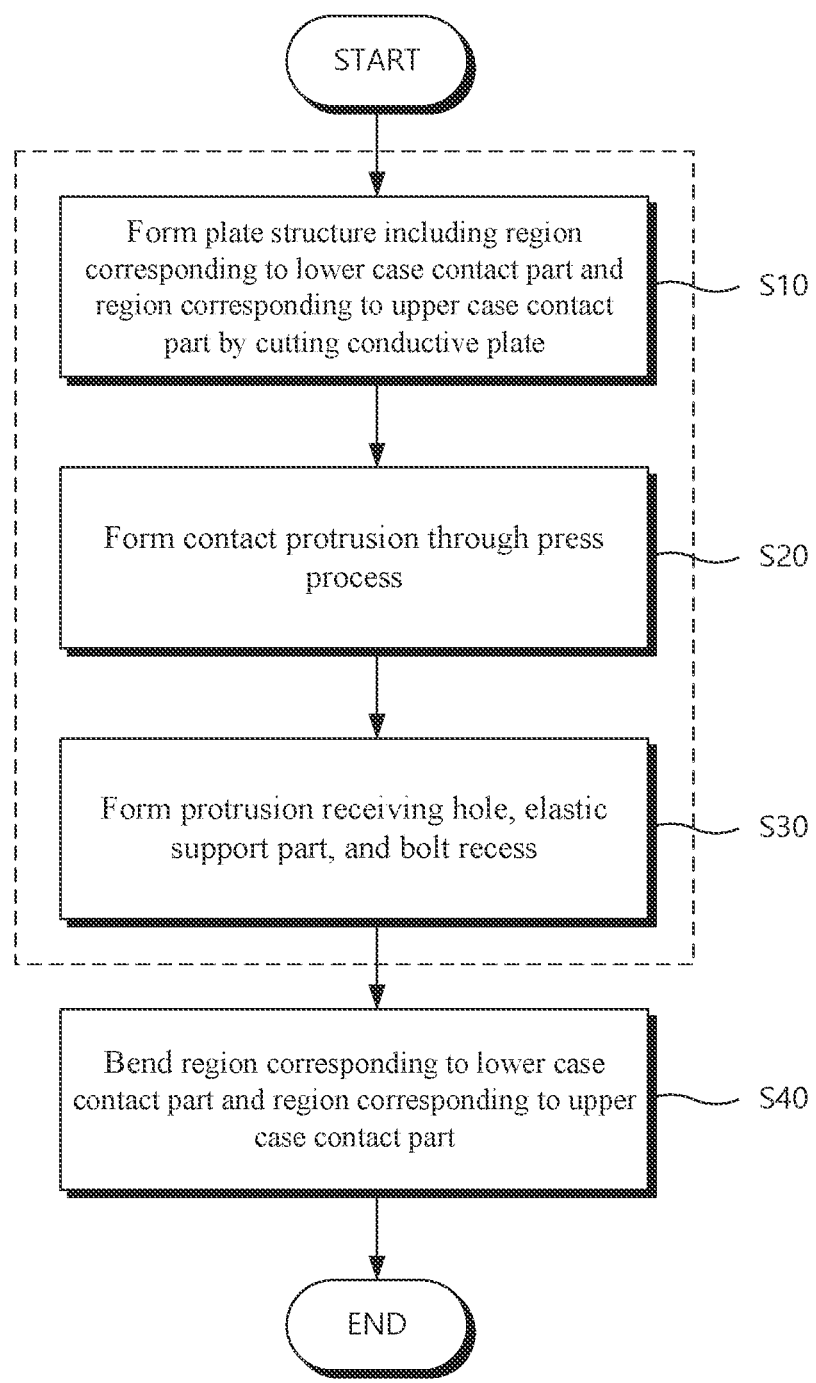
FIG. 7 is a flowchart illustrating one example of a contact gasket manufacturing method of manufacturing the contact gasket according to example embodiments of the present disclosure.
Figure 8:
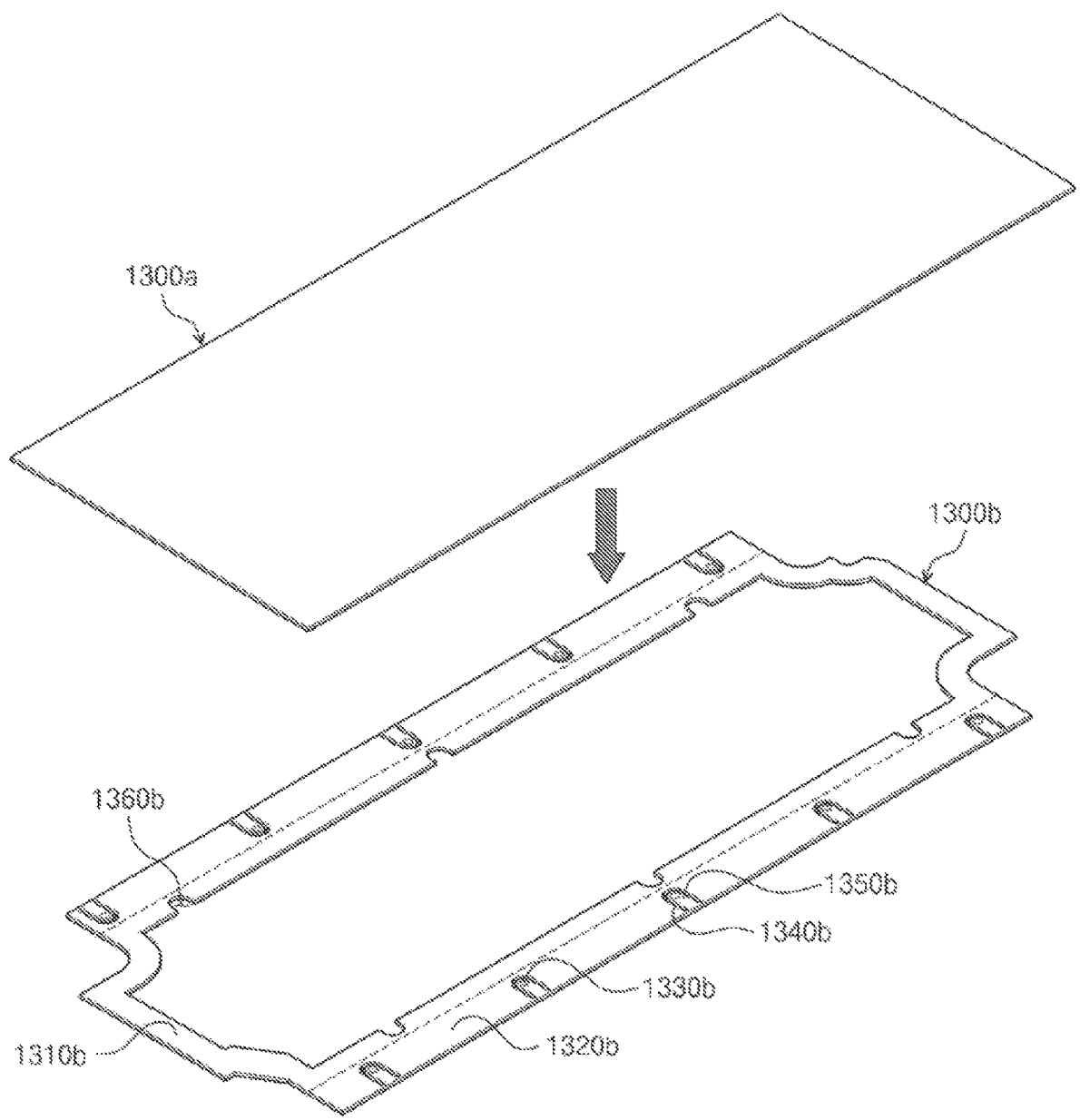
FIGS. 8 and 9 are views sequentially illustrating one example of a manufacturing process of the contact gasket manufactured according to the contact gasket manufacturing method of FIG. 7.
Figure 9:
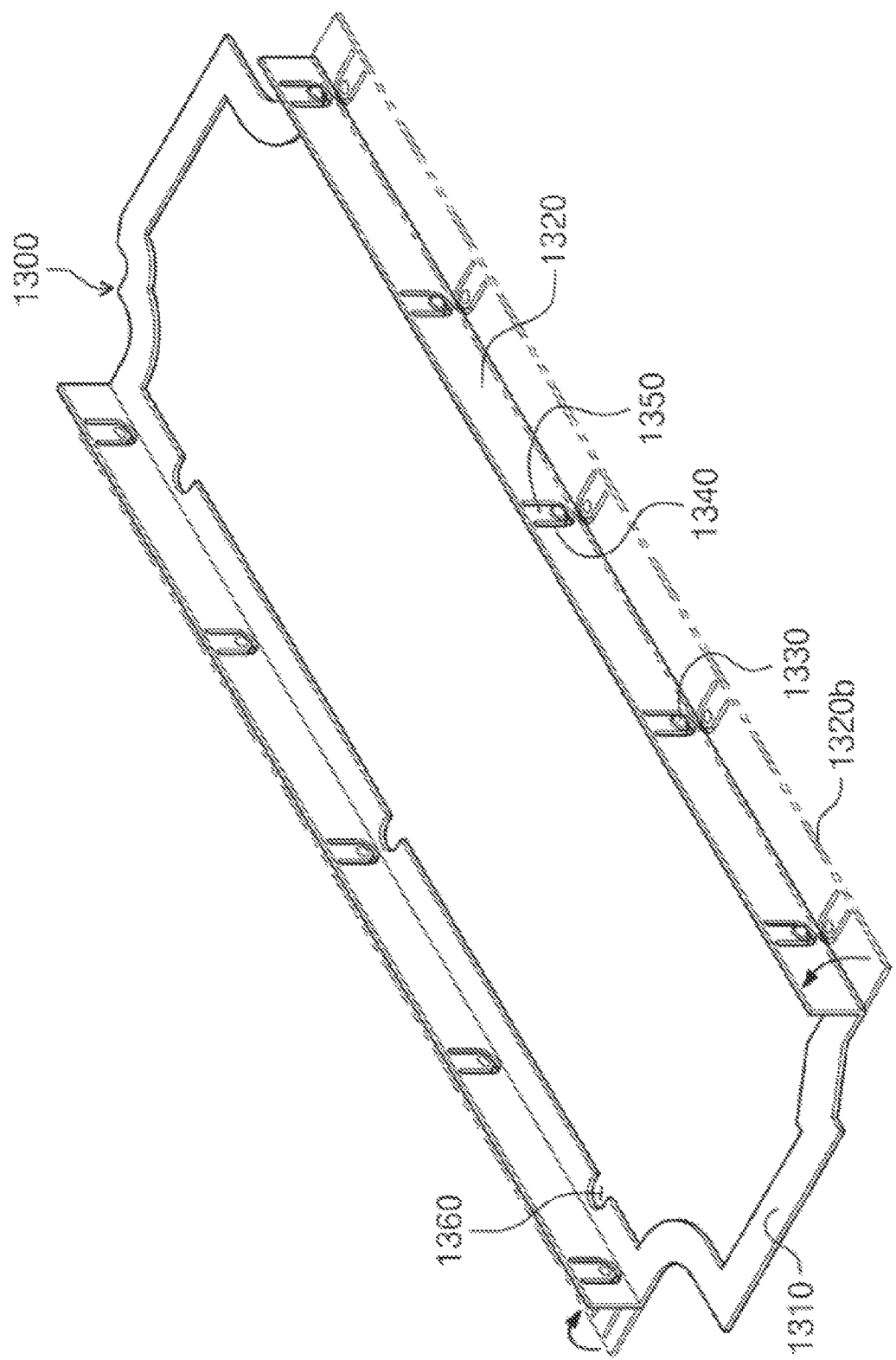

FIG. 7 is a flowchart illustrating one example of a contact gasket manufacturing method of manufacturing the contact gasket according to example embodiments of the present disclosure. FIGS. 8 and 9 are views sequentially illustrating one example of a manufacturing process of the contact gasket manufactured according to the contact gasket manufacturing method of FIG. 7. Referring to FIG. 7, the contact gasket manufacturing method may include a first cutting operation S10, a protrusion forming operation S20, a second cutting operation S30, and a bending operation S40.

In the first cutting operation S10, a plate structure 1300*b* including a region 1310*b* corresponding to the lower case contact part 1310 and a region 1320*b* corresponding to the upper case contact part 1320 is formed by cutting a conductive plate 1300a having elasticity. According to example embodiments, in the first cutting operation S10, the conductive plate 1300a may be cut by a press process using a mold. The conductive plate 1300a may be formed of a conductive metallic material having elasticity.

In the protrusion forming operation S20, the contact protrusion 1330 is formed on the plate structure 1300b through a press process. The first cutting operation S10 and the protrusion forming operation S20 may be simultaneously performed by the same mold. Alternatively, the first cutting operation S10 and the protrusion forming operation S20 may be sequentially performed by different molds. In some example embodiments, the sequence in which the first cutting operation S10 and the protrusion forming operation S20 are performed may be changed as needed.

In the second cutting operation S30, the protrusion receiving hole 1340 and the elastic support part 1350 may be formed by cutting the region 1320b corresponding to the upper case contact part 1320, and the bolt recess 1360 may be formed by cutting the region 1310b corresponding to the lower case contact part 1310. The protrusion receiving hole 1340 and the elastic support part 1350 and/or the lower case contact part 1310 may not be provided in the contact gasket 1300 as needed. Therefore, only a component to be provided among the protrusion receiving hole 1340, the elastic support part 1350, and the lower case contact part 1310 may be formed in the second cutting operation S30. In example embodiments in which the protrusion receiving hole 1340, the elastic support part 1350, and the lower case contact part 1310 are not all provided, the second cutting operation S30 is not performed.

In example embodiments in which the second cutting operation S30 is performed, the first cutting operation S10, the second cutting operation S30, and the protrusion forming operation S20 may be simultaneously performed by the same mold. Alternatively, the first cutting operation S10, the second cutting operation S30, and the protrusion forming operation S20 may be sequentially performed by different molds. In some example embodiments, the sequence in which the first cutting operation S10, the second cutting operation S30, and the protrusion forming operation S20 are performed may be changed as needed.

The bending operation S40 is performed after the first cutting operation S10 and the protrusion forming operation S20 are performed or after the first cutting operation S10, the second cutting operation S30, and the protrusion forming operation S20 are performed. In the bending operation S40, the contact gasket 1300 is formed by bending the region 1310b and the region 1320b of the structure on which the first cutting operation S10 and the protrusion forming operation S20 are performed or by bending the region 1310b and the region 1320b of the plate structure 1300b on which the first cutting operation S10, the protrusion forming operation S20, and the second cutting operation S30 are performed.

As described above, the contact gasket 1300 according to the present disclosure may be provided between the upper case 1200 and the lower case 1100 of the SSD case 1000, the lower case contact part 1310 may be fixedly fastened to the lower case 1100, and the contact protrusion 1330 may be provided to stably maintain the contact of the upper case contact part 1320 with the sidewall 1220 of the upper case 1200. Accordingly, the contact between the upper case 1200 and the lower case 1100 may be stably maintained. Thus, the contact gasket 1300 according to the present disclosure may increase an ESD level of the SSD case 1000.

Figure 10:
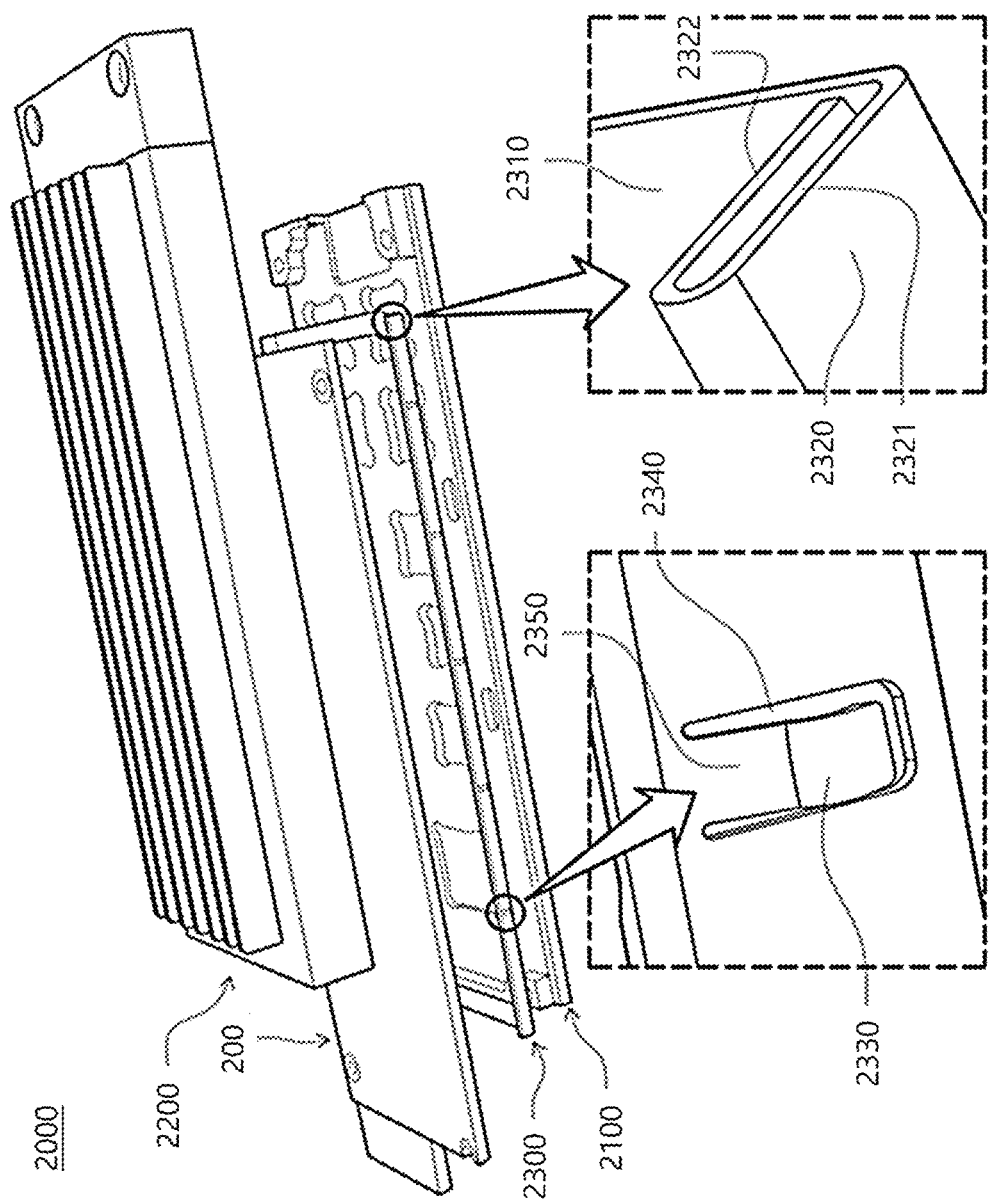
FIG. 10 is an exploded perspective view illustrating an SSD case according to example embodiments of the present disclosure.

FIG. 10 is an exploded perspective view illustrating an SSD case according to example embodiments of the present disclosure. Referring to FIG. 10, an SSD substrate 200 is embedded in the SSD case 2000. The SSD case 2000 includes a lower case 2100, an upper case 2200, and a contact gasket 2300.

An upper portion of the lower case 2100 may be open. The upper case 2200 is fastened with the lower case 2100 to cover the upper portion of the lower case 2100 and forms a space in which the SSD substrate 200 is accommodated. The contact gasket 2300 may be formed of a conductive material having elasticity. The contact gasket 2300 is provided in the space formed by the upper case 2200 and the lower case 2100 and is brought into contact with the upper case 2200 and the lower case 2100. The contact gasket 2300 may include a lower case contact part 2310 and an upper case contact part 2320.

The lower case contact part 2310 makes contact with the lower case 2100. The upper case contact part 2320 makes contact with the upper case 2200. The upper case contact part 2320 extends from the lower case contact part 2310. One of the lower case contact part 2310 and the upper case contact part 2320 is fixedly fastened to the lower case 2100 or the upper case 1200 in contact therewith, and the other one has a contact protrusion 2330 formed thereon. The upper case contact part 2320 may be a sidewall extending upward from an edge of the lower case contact part 2310. The upper case contact part 2320 may be bent in an inverted U-shape at an upper portion and may extend downward. The upper case contact part 2320 may include an outside wall 2321 extending upward from an upper surface of the bottom of the lower case contact part 2310 and an inside wall 2322 extending downward from the U-shaped wall.

The outside wall 2321 of the upper case contact part 2320 may be provided with the contact protrusion 2330, a protrusion receiving hole 2340, and an elastic support part 2350. The contact protrusion 2330 may protrude toward the upper case 2200 such that an end portion is brought into contact with a sidewall of the upper case 2200. The protrusion receiving hole 2340 may be formed through the outside wall 2321 of the upper case contact part 2310.

The elastic support part 2350 extending inward from one position on an inner surface of the protrusion receiving hole 2340 may be provided in the protrusion receiving hole 2340. In the case in which the elastic support part 2350 is provided, the contact protrusion 2330 may be formed on the elastic support part 2350. The elastic support part 2350 may be formed by cutting away a portion of the upper case contact part 2320 such that an upper end of the elastic support part 2350 is connected with the upper case contact part 2320.

Accordingly, when the upper case contact part 2320 has a plate structure, the elastic support part 2350 may also be provided in a plate structure. In some example embodiments, the contact protrusion 2330 may be provided in a structure in which one surface facing toward the sidewall of the upper case 2200 is convex and an opposite surface is concave. To this end, the contact protrusion 2330 may be formed by pressing a surface of the elastic support part 2350 facing a direction away from the sidewall of the upper case 2200 in a direction toward the sidewall of the upper case 2200.

In example embodiments in which the elastic support part 2350 is not provided, one contact protrusion 2330 may excessively protrude further than other contact protrusions 2330 due to a manufacturing tolerance. The excessively protruding contact protrusion 2330 may be pushed by the sidewall. When the upper case contact part 2320 itself is pushed, another contact protrusion 2330 of the corresponding upper case contact part 2320 may not be brought into contact with the sidewall of the upper case 2200.

Accordingly, when the elastic support part 2350 is provided, even though a slightly excessively protruding contact protrusion 2330 is pushed by the sidewall, only the elastic support part 2350 having the contact protrusion 2330 formed thereon may be pushed, and thus contact of other contact protrusions 2330 with the sidewall may not be affected.

Assuming that the contact protrusion 2330 is not provided, a surface of the upper case contact part 2320 that faces toward the sidewall of the upper case 2200 may be in contact with the sidewall of the upper case 2200 while facing the sidewall. In contrast, assuming that the contact protrusion 2330 is provided, a protruding length of the contact protrusion 2330 may be longer than the distance between the upper case contact part 2320 and the sidewall of the upper case 2200 in example embodiments in which the surface of the upper case contact part 2320 that faces toward the sidewall of the upper case 2200 is spaced apart from the sidewall of the upper case 2200.

According to example embodiments, the lower case contact part 2310, the upper case contact part 2320, the contact protrusion 2330, and the elastic support part 2350 may be provided in an integrated structure in which one plate is cut and bent.

As described above, the contact gasket according to the present disclosure may stably maintain the contact between the upper case and the lower case of the SSD case.

The above-described contents are specific example embodiments for carrying out the present disclosure. The present disclosure includes not only the above-described example embodiments but also example embodiments that can be made through a simple design change or can be easily modified. Furthermore, the present disclosure includes technologies that can be carried out by easily modifying the example embodiments. Accordingly, the scope of the present disclosure should not be determined by the above-described example embodiments and should be determined by the accompanying claims and the equivalents thereof.

While the present disclosure has been described with reference to example embodiments thereof, it will be apparent to those of ordinary skill in the art that various changes and modifications may be made thereto without departing from the spirit and scope of the present disclosure as set forth in the following claims.

What is claimed is:

1. An SSD case comprising:
    a lower case including a bottom wall and an open upper portion;
    an upper case fastened with the lower case to cover the open upper portion and configured to form a space in which an SSD substrate is accommodated; and
    a contact gasket formed of a conductive material having elasticity and provided in the space so as to be brought into contact with the upper case and the lower case, wherein the contact gasket includes:
        a lower case contact part configured to make contact with the lower case; and
        an upper case contact part configured to extend from the lower case contact part and make contact with the upper case,
    wherein one of the lower case contact part and the upper case contact part is fixedly fastened to the lower case or the upper case in contact therewith, and
    wherein a contact protrusion configured to protrude toward the lower case or the upper case such that an end is brought into contact with the lower case or the upper case is formed on the other one of the lower case contact part and the upper case contact part.

2. The SSD case of claim 1, wherein the upper case includes:
    an upper wall configured to cover the open upper portion of the lower case; and
    a sidewall configured to extend downward from a periphery of the upper wall,
        wherein the lower case contact part is fixedly fastened to the bottom wall so as to be brought into contact with an upper surface of the bottom wall,
        wherein the upper case contact part extends from an upper surface of the lower case contact part, and
        wherein the contact protrusion protrudes toward the sidewall from a surface of the upper case contact part configured to face toward the sidewall such that the end is brought into contact with the sidewall.

3. The SSD case of claim 2, wherein the lower case contact part has a shape extending along an edge region of the upper surface of the bottom wall, and
    wherein the upper case contact part extends upward from a partial area of an edge region of the upper surface of the lower case contact part configured to face the sidewall.

4. The SSD case of claim 3, wherein the lower case contact part is provided in a ring shape extending along the edge region of the upper surface of the bottom wall when the upper surface of the bottom wall is viewed.

5. The SSD case of claim 4, wherein the lower case further includes a plurality of fastening protrusions to which fastening members configured to fasten the upper case and the lower case are fastened, the fastening protrusions being arranged along a periphery of the lower case, and
    wherein the lower case contact part extends along an inside region of the fastening protrusion configured to face toward a central region of the lower case.

6. The SSD case of claim 3, wherein the lower case contact part has a plate structure in which opposite surfaces are parallel to the upper surface of the bottom wall, and
    wherein the upper case contact part has a plate structure in which opposite surfaces are parallel to an inside surface of the sidewall.

7. The SSD case of claim 6, wherein a protrusion receiving hole is formed through opposite surfaces of the upper case contact part,
    wherein an elastic support part configured to extend inward from one position on an inner surface of the protrusion receiving hole is provided in the protrusion receiving hole, and
    wherein the contact protrusion is formed on the elastic support part.

8. The SSD case of claim 1, wherein the lower case contact part, the upper case contact part, and the contact protrusion are provided in an integrated structure in which one plate is cut and bent.

9. A contact gasket provided in a receiving space for an SSD substrate so as to be brought into contact with a lower case and an upper case, wherein the lower case includes a bottom wall and an open upper portion and the upper case is fastened with the lower case to cover the open upper portion and forms the receiving space in which the SSD substrate is accommodated, the contact gasket comprising:
    a lower case contact part configured to make contact with the lower case; and
    an upper case contact part configured to extend from the lower case contact part and make contact with the upper case, wherein one of the lower case contact part and the upper case contact part is fixedly fastened to the lower case or the upper case in contact therewith, and wherein a contact protrusion configured to protrude toward the lower case or the upper case such that an end is brought into contact with the lower case or the upper case is formed on the other one of the lower case contact part and the upper case contact part.

10. The contact gasket of claim 9, wherein the upper case includes:

an upper wall configured to cover the open upper portion of the lower case; and a sidewall configured to extend downward from a periphery of the upper wall, wherein the lower case contact part is fixedly fastened to the bottom wall so as to be brought into contact with an upper surface of the bottom wall, wherein the upper case contact part extends from an upper surface of the lower case contact part, and wherein the contact protrusion protrudes toward the sidewall from a surface of the upper case contact part configured to face toward the sidewall such that the end is brought into contact with the sidewall.

11. The contact gasket of claim 10, wherein the lower case contact part has a shape extending along an edge region of the upper surface of the bottom wall, and wherein the upper case contact part extends upward from a partial area of an edge region of the upper surface of the lower case contact part configured to face the sidewall.

12. The contact gasket of claim 11, wherein the lower case contact part is provided in a ring shape extending along the edge region of the upper surface of the bottom wall when the upper surface of the bottom wall is viewed.

13. The contact gasket of claim 12, wherein the lower case further includes a plurality of fastening protrusions to which fastening members configured to fasten the upper case and the lower case are fastened, the fastening protrusions being arranged along a periphery of the lower case, and wherein the lower case contact part extends along an inside region of the fastening protrusion configured to face toward a central region of the lower case.

14. The contact gasket of claim 11, wherein the lower case contact part has a plate structure in which opposite surfaces are parallel to the upper surface of the bottom wall, and wherein the upper case contact part has a plate structure in which opposite surfaces are parallel to an inside surface of the sidewall.

15. The contact gasket of claim 14, wherein a protrusion receiving hole is formed through opposite surfaces of the upper case contact part, wherein an elastic support part configured to extend inward from one position on an inner surface of the protrusion receiving hole is provided in the protrusion receiving hole, and wherein the contact protrusion is formed on the elastic support part.

16. The contact gasket of claim 9, wherein the lower case contact part, the upper case contact part, and the contact protrusion are provided in an integrated structure in which one plate is cut and bent.

17. A method for manufacturing a contact gasket provided in a receiving space for an SSD substrate so as to be brought into contact with a lower case and an upper case, wherein the lower case includes a bottom wall and an open upper portion, the upper case is fastened with the lower case to cover the open upper portion and forms the receiving space in which the SSD substrate is accommodated, the contact gasket includes a lower case contact part configured to make contact with the lower case and an upper case contact part configured to extend from the lower case contact part and make contact with the upper case, one of the lower case contact part and the upper case contact part is fixedly fastened to the lower case or the upper case in contact therewith, and a contact protrusion configured to protrude toward the lower case or the upper case such that an end is brought into contact with the lower case or the upper case is formed on the other one of the lower case contact part and the upper case contact part, the method comprising:

a first cutting operation of forming a plate structure including a region corresponding to the lower case contact part and a region corresponding to the upper case contact part by cutting a conductive plate having elasticity;

a protrusion forming operation of forming the contact protrusion on the plate structure through a press process; and a bending operation of forming the contact gasket by bending the region corresponding to the lower case contact part of the plate structure and the region corresponding to the upper case contact part of the plate structure.

18. The method of claim 17, wherein the first cutting operation and the protrusion forming operation are simultaneously performed by the same mold.

19. The method of claim 17, wherein a protrusion receiving hole is formed through opposite surfaces of the upper case contact part, an elastic support part configured to extend inward from one position on an inner surface of the protrusion receiving hole is provided in the protrusion receiving hole, and the contact protrusion is formed on the elastic support part, and wherein the method further comprises a second cutting operation of forming the protrusion receiving hole and the elastic support part by cutting the region corresponding to the upper case contact part.

20. The method of claim 19, wherein the first cutting operation, the second cutting operation, and the protrusion forming operation are simultaneously performed by the same mold.

* * * * *